(12) United States Patent
Rasmussen et al.

(10) Patent No.: US 11,815,554 B2
(45) Date of Patent: Nov. 14, 2023

(54) IDENTIFYING DATA VALID WINDOWS (71) Applicant: Micron Technology, Inc., Boise, ID (US)

(72) Inventors: Phillip A. Rasmussen, Boise, ID (US); Christopher D. Gagliano, Boise, ID (US)

(73) Assignee: Micron Technology, Inc., Boise, ID (US)

(*) Notice: Subject to any disclaimer, the term of this patent is extended or adjusted under 35 U.S.C. 154(b) by 197 days.

(21) Appl. No.: 17/153,726

(22) Filed: Jan. 20, 2021

(65) Prior Publication Data

US 2022/0229108 A1    Jul. 21, 2022

(51) Int. Cl.
G01R 31/3177    (2006.01)
G01R 31/317    (2006.01)
G01R 31/319    (2006.01)
G01R 31/3181    (2006.01)
G01R 31/30    (2006.01)
G06F 11/26    (2006.01)
G06F 11/22    (2006.01)

(52) U.S. Cl.
CPC ..... *G01R 31/3177* (2013.01); *G01R 31/3004* (2013.01); *G01R 31/31708* (2013.01); *G01R 31/31711* (2013.01); *G01R 31/31724* (2013.01); *G01R 31/31725* (2013.01); *G01R 31/31813* (2013.01); *G01R 31/31924* (2013.01); *G06F 11/2205* (2013.01); *G06F 11/26* (2013.01)

(58) Field of Classification Search
CPC .......... G01R 31/3177; G01R 31/31724; G01R 31/31725; G01R 31/31813; G01R 31/31924; G01R 31/3004; G01R 31/31711; G01R 31/31708; G06F 11/26; G06F 11/2205
USPC ................ 714/724, 728, 738, 739, 742, 745
See application file for complete search history.

(56) References Cited

U.S. PATENT DOCUMENTS

| 5,537,550 | A | * | 7/1996 | Russell | ................. | G06F 3/1229 |
| | | | | | | 709/224 |
| 6,445,627 | B1 | * | 9/2002 | Nakahara | ............. | G11C 29/848 |
| | | | | | | 365/219 |
| 7,461,295 | B1 | * | 12/2008 | Iyengar | .............. | G01R 31/3016 |
| | | | | | | 714/25 |
| 8,250,418 | B2 | * | 8/2012 | Grunzke | ............. | G06F 12/0802 |
| | | | | | | 365/201 |
| 2002/0078734 | A1 | * | 6/2002 | Williams | ............... | G01B 13/20 |
| | | | | | | 73/37 |

(Continued)

*Primary Examiner* — John J Tabone, Jr.
(74) *Attorney, Agent, or Firm* — TraskBritt (57) ABSTRACT

A tester including an interface configured to interface with an electronic device and a logic circuit. The logic circuit includes a pattern generator and at least one finite-state machine and is configured to sequentially acquire read data from the electronic device at sequential testing points of a testing range for evaluating an operating parameter of the electronic device or the tester until a set of consecutive passing points having a first passing point and a last passing point is identified, in response to identifying the first passing point, write data within the logic circuit of the tester identifying the first passing point, in response to identifying the last passing point, write data within the logic circuit of the tester identifying the last passing point, and output only data identifying the first passing point and data identifying the last passing point to a software application.

25 Claims, 4 Drawing Sheets

(56) References Cited

U.S. PATENT DOCUMENTS

| | | | | |
|---|---|---|---|---|
| 2004/0168950 A1* | 9/2004 | Barker | ............... | B65D 75/26 |
| | | | | 206/528 |
| 2006/0194552 A1* | 8/2006 | Jin | ............... | H04B 17/29 |
| | | | | 455/226.1 |
| 2012/0047411 A1* | 2/2012 | Lai | ............... | G01R 31/31937 |
| | | | | 714/721 |
| 2014/0046613 A1* | 2/2014 | Roberts, Jr. | ............... | G01R 31/2601 |
| | | | | 702/108 |
| 2018/0300176 A1* | 10/2018 | Chen | ............... | G06F 9/5027 |
| 2018/0321303 A1* | 11/2018 | Chen | ............... | G01R 31/01 |
| 2022/0229108 A1* | 7/2022 | Rasmussen | ............... | G01R 31/31924 |

* cited by examiner

IDENTIFYING DATA VALID WINDOWS

FIELD

Embodiments of the disclosure relate generally to electronic device testers for testing electronic devices, methods of testing electronic devices, and related systems and methods.

BACKGROUND

Electronic devices (e.g., microelectronic devices, semiconductor devices, memory devices) typically require testing to verify functionality. For example, semiconductor devices (e.g., integrated circuits) are typically subjected to functional testing in which input signals are input into the electronic device, and output signals from the electronic device are observed in order to verify the proper functioning of the electronic device.

Electronic device testers (e.g., memory device testers) often utilize a pattern generator (e.g., an algorithm pattern generator) to generate testing patterns for testing an electronic device, especially when testing memory devices. The pattern generator is utilized for coding instructions in order to test data reading/writing operations.

As capacity of electronic devices (e.g., memory devices) has increased, time necessary to test the electronic devices has increased. For example, electronic device testers typically test (e.g., run a sweep of) electronic devices to identify a testing range (e.g., time period, voltage range, etc.) over which a condition of the electronic device returns expected results (e.g., read data). Additionally, during the test, each point of the testing range is run, the results for each point are stored, and then software is utilized to analyze (e.g., sort through) the stored data to determine bounds of data valid windows. Furthermore, the stored data typically includes multiple results for every pin. Therefore, the time required to read, store, and process all of the results adds significant test time to the test (e.g., the sweep) of an electronic device.

DETAILED DESCRIPTION

The illustrations presented herein are not actual views of any particular electronic device (e.g., semiconductor device) or electronic device tester but are merely idealized representations employed to describe example embodiments of the disclosure. The following description provides specific details of embodiments of the disclosure in order to provide a thorough description thereof. However, a person of ordinary skill in the art will understand that the embodiments of the disclosure may be practiced without employing many such specific details. Indeed, the embodiments of the disclosure may be practiced in conjunction with conventional techniques employed in the industry. In addition, the description provided below does not include all elements to form a complete structure or assembly. Only those process acts and structures necessary to understand the embodiments of the disclosure are described in detail below. Additional conventional acts and structures may be used. Also note, any drawings accompanying the application are for illustrative purposes only, and are thus not drawn to scale. Additionally, elements common between figures may have corresponding numerical designations.

As used herein, the terms "comprising," "including," and grammatical equivalents thereof are inclusive or open-ended terms that do not exclude additional, un-recited elements or method steps, but also include the more restrictive terms "consisting of" "consisting essentially of," and grammatical equivalents thereof.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, the term "configured" refers to a size, shape, material composition, orientation, and arrangement of one or more of at least one structure and at least one apparatus facilitating operation of one or more of the structure and the apparatus in a predetermined way.

As used herein, the singular forms following "a," "an," and "the" are intended to include the plural forms as well, unless the context clearly indicates otherwise.

As used herein, the term "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "match" in reference to read data (e.g., output data) and expected data means and includes that the read data and the expected data are equivalent to a degree that one of ordinary skill in the art would understand that the read data and the expected data are a match, such as within acceptable testing variances, tolerances, and degree of error. By way of example, depending on the particular read data and the expected data, the read data and the expected data may be a match if the read data is within less than 10%, less than 5%, or less than 1% of the expected data.

As used herein, a "memory device" means and includes a microelectronic device exhibiting memory functionality, but not necessarily limited to memory functionality. Stated another way, and by way of non-limiting example only, the term "memory device" includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

Embodiments of the disclosure include an electronic device tester (e.g., an electronic device tester) and methods for testing electronic devices (e.g., microelectronic devices, semiconductor devices, memory devices). The electronic device tester may generate test signals and test patterns for testing (e.g., inputting into) electronic devices and for acquiring (e.g., receiving) return output (e.g., signals and/or read data) from the electronic devices during testing procedures. Furthermore, the electronic device tester may be utilized to determine and identify data valid windows for various operating parameters (e.g., windows within which a given condition passes) of the electronic device through testing and evaluating electronic devices.

The electronic device tester may include a pattern generator (e.g., an algorithmic pattern generator), and the pattern generator may be utilized to code instruction in order to effectuate data reading/writing test operations. Additionally, the pattern generator may include one or more for consistency finite-state machines. Each of the finite-state machines may include a mathematical model of computation. Furthermore, each of the finite-state machines may be in one of a finite number of states at any given time. Each of the finite-state machines may change from one state to another in response to particular inputs. The pattern generator and the finite-state machines may form at least a part of a logic circuit (e.g., hardware) of the electronic device tester. Furthermore, during test procedures for identifying data valid windows, the electronic device tester may only store (e.g., write) data (e.g., sets values within result registers of the logic circuit) regarding bounds (e.g., first and last passing points) of identified data valid windows. Accordingly, the hardware of the electronic device tester only reports first and last passing point of the data valid window and other diagnostic information to assist debug situations where no data valid window was identified.

The electronic device tester and the methods described herein at least substantially replace conventional software approaches for calculating data valid windows. Furthermore, the electronic device tester and methods described herein may be advantageous over conventional testers and methods of testing electronic devices. For example, by only storing (writing) data (e.g., setting values within result registers of the logic circuit) regarding bounds (e.g., first and last passing points) of identified data valid windows, instead of storing pass/fail data for each testing point, the electronic device tester and methods according to embodiments of the disclosure reduce required testing time and decrease a complexity of software needed for processing the stored data. For instance, because the electronic device tester only stores results of the first and last passing points of a sweep test and/or other minimal diagnostic information, only those results are provided (e.g., output) to testing software (e.g., external software application and/or program), and the testing software only has to process the first and last passing points and the other minimal diagnostic information. Furthermore, the electronic device tester according to embodiments of the disclosure only has to spend time storing the results of the first and last passing points. Therefore, time conventionally required to read, store, and process the result of each testing point is significantly reduced. For example, pass/fail information for each testing point in the sweep test does not need to be read out (e.g., read out to processing software). For instance, the finite-state machine and logic circuit of the electronic device tester only output (e.g., report) the first and last passing points of an identified acceptable data valid window.

Furthermore, some semiconductor devices (e.g., memory devices and/or graphics devices) require data valid window (i.e., data eye) training every time the semiconductor devices are initialized, which occurs in every test. Therefore, in some instances, while the reduction of testing time provided by the electronic device tester and methods described herein is dependent on a resolution of the sweep test (e.g., number and concentration of testing points), a configuration readout time, and other factors, the electronic device tester and methods described herein may reduce conventional training time by more than 50% while achieving higher resolution and simplifying the process.

Additionally, by reducing the amount of time required to test electronic devices, the electronic device tester and methods of the disclosure may decrease production time and may increase overall production. Increasing overall production may lead to increased sales and revenue. Furthermore, by reducing the amount of time required to test electronic devices, the electronic device tester and methods of the disclosure may enable higher resolution tests to be performed within conventional time requirements.

Figure 1:
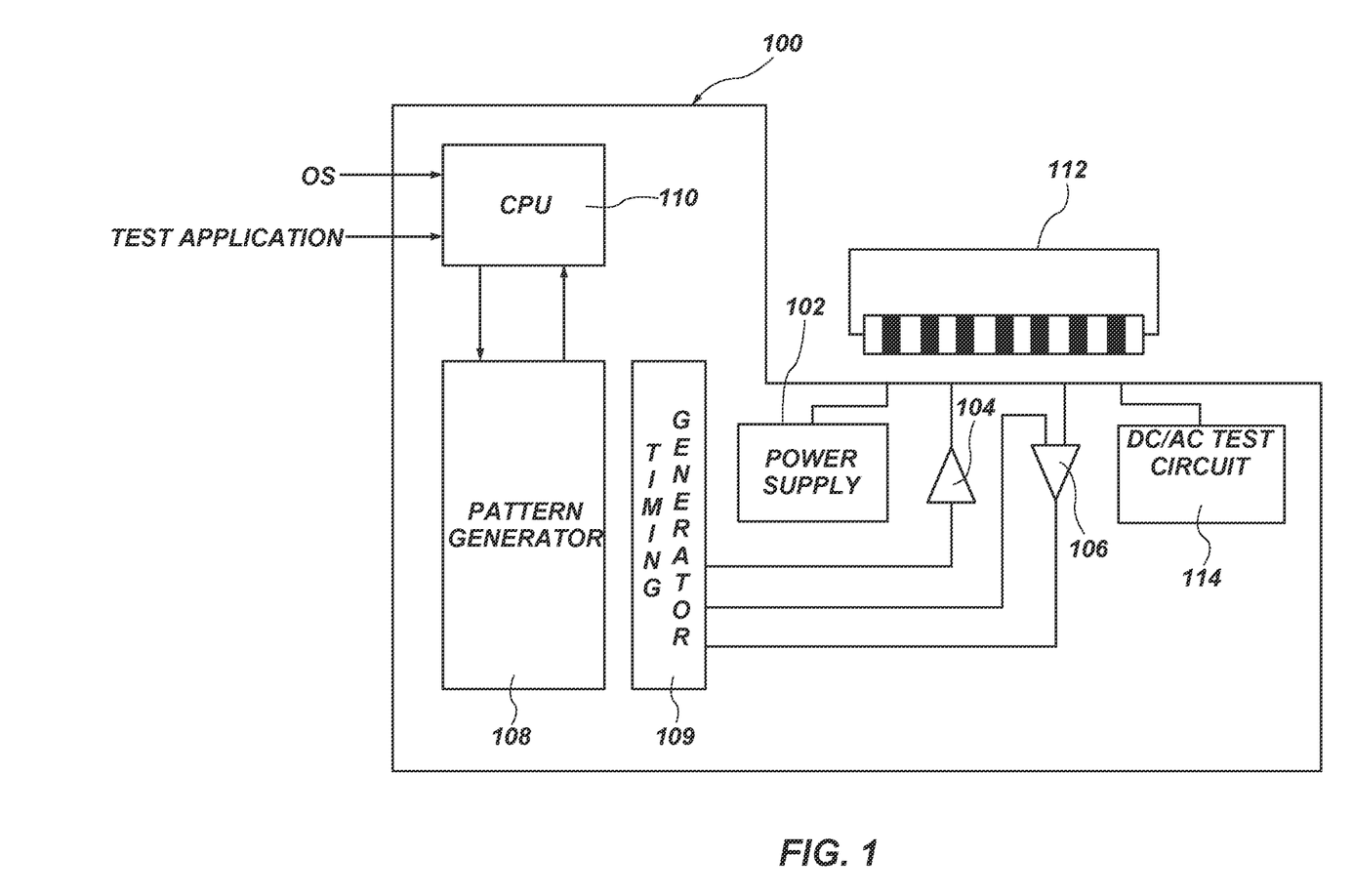
FIG. 1 shows a schematic view of an electronic device tester according to one or more embodiments of the disclosure.

FIG. 1 shows a schematic diagram of an electronic device tester 100 for testing electronic devices (e.g., semiconductor devices) according to one or more embodiments of the disclosure. As used herein, the term "semiconductor device" may include memory devices (e.g., NAND Flash memory devices), graphic devices (e.g., Graphics Double Data Rate Synchronous Dynamic Random-Access Memory), microelectronic devices, and/or microelectronic device structures. As is described in further detail below, the electronic device tester 100 may generate test signals and test patterns for testing electronic devices and for acquiring (e.g., receiving) return output (e.g., signals and/or data) from the electronic devices during testing procedures. Additionally, the electronic device tester 100 may be utilized to test in real time.

As is also described in greater detail below, the electronic device tester 100 may be utilized to determine and identify data valid windows for various operating parameters of an electronic device 112 (e.g., windows within which a given condition of the electronic device 112 passes (e.g., returns expected read data)) through testing and evaluating electronic devices 112. In some embodiments, the electronic device tester 100 may be utilized to grade electronic devices 112 based at least partially on the determined data valid windows.

In some embodiments, the electronic device tester 100 may include a power supply 102, a driver 104, a comparator 106, a pattern generator 108, a timing generator 109, and a central processing unit 110. In some embodiments, one or more of the driver 104, the comparator 106, the pattern generator 108, and the central processing unit ("CPU") 110 may form a part of a logic circuit of the electronic device tester 100.

The power supply 102 may be utilized by the electronic device tester 100 to apply voltages to the electronic device 112 to be tested. The driver 104 may be utilized by the electronic device tester 100 to input one or more signals to the electronic device 112. The comparator 130 may be utilized by the electronic device tester 100 to compare a signal output from the electronic device 112 with an expected value and/or values within the electronic device tester 100. The pattern generator 108 may be utilized by the electronic device tester 100 to generate signal arrays (i.e., test patterns) which are input to the electronic device 112 via the driver 104. The timing generator 109 may be utilized by the electronic device tester 100 to generate (e.g., determine) timing for the signals (e.g., signal arrays) which are input to the electronic device 112. The CPU 110 may serve as a controller for the power supply 102, the driver 104, the comparator 106, the pattern generator 108, and the timing generator 109. Additionally, during operation, the CPU 110 may read from an external storage device and interpret the read data by an operating system (OS), thereby generating and a determining signals for testing the electronic device 112 (e.g., testing patterns) and carrying out predetermined tests. In some embodiments, the electronic device tester 100 may further include an AC/DC test circuit 114 for effectuating AC and DC tests on the electronic device 112, such as detection of output voltage levels or output current levels from the electronic device 112 during a test.

Referring still to FIG. 1, in some embodiments, the pattern generator 108 may include an algorithmic pattern generator, and the algorithmic pattern generator may be utilized to code an instruction in order to effectuate data reading/writing test operations. Additionally, the pattern generator 108 may include multiple (e.g., a plurality) of finite-state machines. Each of the finite-state machines may include a mathematical model of computation. Furthermore, each of the finite-state machines may be in one of a finite number of states at any given time. Each of the finite-state machines may change from one state to another in response to particular inputs. As is known in the art, a change from one state to another is typically referred to as a transition. Typically, a finite-state machine is defined by a list of its states, its initial state, and the inputs that trigger each transition. In some embodiments, the pattern generator 108 may include the finite-state machines for each of the pins of the electronic device tester 100. Additionally, each of the finite-state machines of a given pin of a bus of the electronic device tester 100 may be utilized to track result (e.g., read data) within the given pin. The pins of the electronic device tester 100 may include data and command pins (e.g., input and output pins) and during testing procedures may have assigned values for read and write commands (i.e., signals) for transmitting to and receiving from the electronic device 112. State machine logic of the finite-state machines is further described below in regard to FIG. 1.

In some embodiments, one or more of the CPU 110, the driver 104, the comparator 106, the pattern generator 108, the timing generator 109, and AC/DC test circuit 170 may form a logic circuit of the electronic device tester 100.

In some embodiments, the electronic device tester 100 may also be operably coupled to an external controller having memory and software, and the software may interface with the electronic device tester 100 (e.g., the hardware of the electronic device tester 100).

As is described in greater detail below, during operation, the electronic device tester 100 may be utilized to evaluate operating parameters of the electronic device 112 and/or the electronic device tester 100 based on conditions of the electronic device 112 throughout testing ranges. For example, the electronic device tester 100 may subject the electronic device 112 to a given input (e.g., an applied test pattern) and may determine a range (e.g., a period of time, a range of voltages, etc.) over which the electronic device 112 returns (e.g., outputs) an expected result (i.e., read data) when subjected to the given input (e.g., a range over which a condition (e.g., output) of the electronic device 112 passes). In other words, the electronic device tester 100 may be utilized to determine ranges, when subjecting the electronic device 112 to the given input, over which read data (e.g., output) from the electronic device 112 matches an expected result. The range may represent a data valid window for an operating parameter of the electronic device 112 and/or the electronic device tester 100. As used herein, the term "data valid window" refers to a range (e.g., duration) over which valid data (e.g., expected data) can be read from the electronic device 112 based on the given input to which the electronic device 112 is subjected. Put yet another way, the electronic device tester 100 may be utilized to identify data valid windows of the electronic device 112 for one or more operating parameters of the electronic device 112 and/or the electronic device tester 100.

In some embodiments, the electronic device tester 100 may be utilized to determine data valid windows of the electronic device 112 for evaluating one or more of DC voltage parameters or AC voltage parameters for the electronic device 112. For example, electronic device tester 100 may be utilized to determine data valid windows of the electronic device 112 for evaluating one or more of device (e.g., electronic device 112) supply voltages, device reference voltages (e.g., Vref), and device output voltages (e.g., VOH, VOL). Additionally, the electronic device tester 100 may be utilized to determine data valid windows of the electronic device 112 for evaluating driver voltages (e.g., high and/or low signal voltage levels coming from the electronic device tester 100 to the electronic device 112). As is described in greater detail below, the DC voltage parameters or AC voltage parameters for the electronic device 112 may be evaluated by subjecting the electronic device 112 to a range of voltages.

In one or more embodiments, the electronic device tester 100 may be utilized to determine data valid windows of the electronic device 112 for evaluating one or more AC timing parameters for the electronic device 112. For example, electronic device tester 100 may be utilized to determine data valid windows of the electronic device 112 for evaluating one or more of clock frequency, pin-to-pin timings (e.g., setup timing, hold timing, alignment timing, and training timing), command-to-command timings, read-data strobe placement, write-data edge placement, or edge-to-edge timings (e.g., duty cycle). As is described in greater detail below, the AC timing parameters for the electronic device 112 may be evaluated by subjecting the electronic device 112 to AC timing signals.

Furthermore, based at least partially on identified data valid windows of the electronic device 112, other parameters may be evaluated and adjusted. For example, based at least partially on identified data valid windows of the electronic device 112, configuration register settings (e.g., mode register settings) and/or test mode settings may be evaluated and adjusted. In view of the foregoing, based at least partially on the identified data valid windows, operating parameters of the electronic device 112 and/or the electronic device tester 100 may be evaluated.

Figure 2:
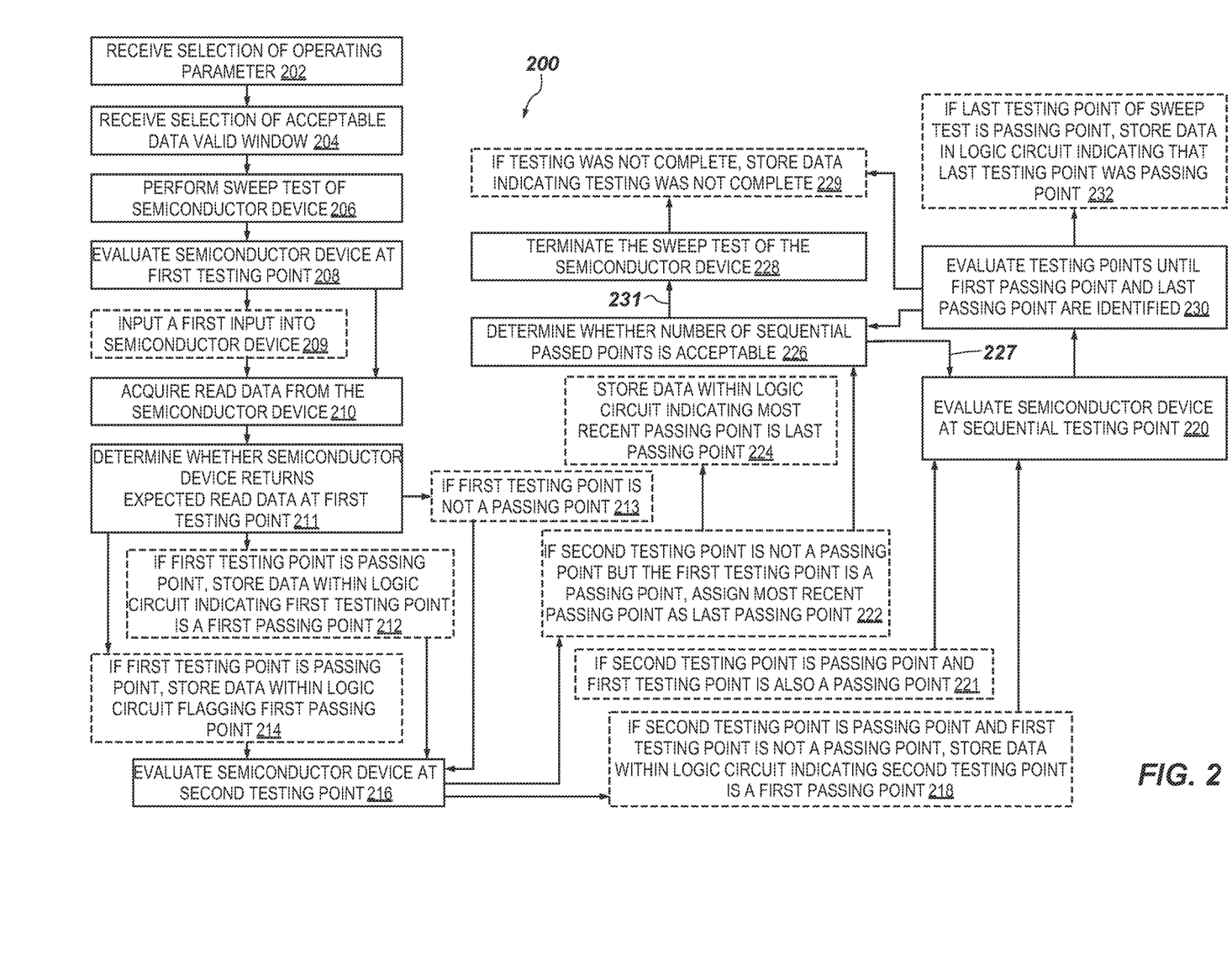
FIG. 2 shows a flow diagram of a method of testing electronic devices according to one or more embodiments of the disclosure.

FIG. 2 depicts a schematic flow chart of a method 200 of determining a data valid window (associated with a selecting operating parameter) for an electronic device and/or an electronic device tester. The description of FIG. 2 includes references to the electronic device tester 100 and the electronic device 112 of FIG. 1.

In some embodiments, the method 200 may include receiving a selection of an operating parameter of the electronic device 112 and/or the electronic device tester 100 to evaluate, as shown in act 202 of FIG. 2. In one or more embodiments, receiving the selection of the operating parameter of the electronic device 112 and/or the electronic device tester 100 to evaluate may include receiving the selection from an external controller and/or software application (e.g., a testing application or program). For example, the electronic device tester 100 may receive the selection of the operating parameter from an external controller and/or software application (e.g., a testing application). The selected operating parameter may have an associated test mode (e.g., type of input signals for evaluating the operating parameter) and an associated testing range within which read data from the electronic device 112 is expected to match expected data (e.g., a condition of the electronic device 112 is expected to pass) over at least a portion of the testing range and within which a data valid window (e.g., the portion of the testing range over which the given condition passes) is expected.

As discussed above, in some embodiments, the testing range may include a time period relative to a particular event (e.g., clock edge, start point, an input of voltage, etc.), a range of voltages, or any other conventional testing ranges of operating parameters of electronic devices (e.g., semiconductor devices). Furthermore, the testing range may include multiple (e.g., a plurality) of sequential testing points associated with the testing range. For example, when the testing range is a time period, each testing point of the sequential testing points may represent a point in time within that time period at which read data is acquired from the electronic device 112. In some embodiments, the sequential testing points may be equidistantly spaced part from each other. For instance, the first testing point may be one millisecond after the particular event and a second testing point may be two milliseconds after the particular event. As another non-limiting example, when the testing range is a range of voltages, the first testing point may represent a first input voltage (e.g., one millivolt) and measuring an output voltage (e.g., a response) from the electronic device 112, and the second testing point may represent a second input voltage (e.g., two millivolts) and measuring an output voltage (e.g., a response) from the electronic device 112. As is discussed below, at each of the testing points of the sequential testing points, read data from the electronic device 112 is evaluated relative to an expected value to determine whether the respective testing point passes or fails.

In some embodiments, receiving a selection of the operating parameter to evaluate may also include receiving a selection of an acceptable data valid window size for the operating parameter, as shown in act 204 of FIG. 2. For example, receiving a selection of the operating parameter to evaluate may include receiving a selection of an acceptable data valid window size to report from/via an external controller and/or software application (e.g., a testing application). In some embodiments, the acceptable valid window size may be user-defined. For instance, the electronic device tester 100 may receive the selection of the acceptable data valid window size from an external controller and/or software application (e.g., a testing application or program). In some embodiments, a selection of an acceptable data valid window size may define a minimum data valid window size to warrant ending a sweep test and reporting (e.g., provide output data regarding) the data valid window. In some embodiments, the acceptable data valid window size may be defined as at least a portion of the testing range. For example, the selected acceptable data valid window may indicate that a particular number of consecutive testing points of the sequential testing points that must pass in order to qualify as an acceptable data valid window. In other embodiments, the selected acceptable data valid window may represent a time period, a range of voltages, or range of any other conventional input signals over which the condition of the electronic device 112 must pass.

Based on the selected operating parameter to evaluate, the method 200 may include performing a sweep test on the electronic device 112 at least partially via hardware (e.g., logic circuit) of the electronic device tester 100, as shown in act 206. For example, the electronic device tester 100 (e.g., the finite-state machines within the algorithmic pattern generator of the electronic device tester 100) may perform the sweep test on the electronic device 112. As is described below, performing the sweep test on the electronic device 112 may include evaluating read data from the electronic device 112 at least some of the testing points of the sequential testing points of the testing range associated with the selected operating parameter. Furthermore, how the testing points are executed may be defined by a testing mode associated with the selected operating parameter. An example logic flow chart for a sweep test is described in greater detail below in regard to FIG. 1.

Performing the sweep test may include evaluating the electronic device 112 at a first testing point of the sequential testing points of the testing range associated with the selected operating parameter via the logic circuit of the electronic device tester 100, as shown in act 208 of FIG. 2. For example, the electronic device tester 100 may evaluate the electronic device 112 at the first testing point of the sequential testing points. In some embodiments, evaluating the electronic device 112 at the first testing point may optionally include inputting a first input associated with the first testing point of the sequential testing points, as shown act 209 of FIG. 2. For example, evaluating the electronic device 112 at the first testing point may include inputting a first voltage value, a first timing signal (e.g., AC timing signal), or any other conventional signal. In one or more embodiments, evaluating the electronic device 112 at the first testing point may include acquiring read data (e.g., an output) from the electronic device 112, as shown in act 210 of FIG. 2. Referring to acts 209 and 210 together, as a non-limiting example, evaluating the electronic device 112 at the first testing point may include inputting a first voltage level into the electronic device 112 and reading an output voltage (e.g., response voltage) from the electronic device 112. As another non-limiting example, evaluating the electronic device 112 at the first testing point may include acquiring read data (e.g., output data) from the electronic device 112 without inputting an input.

In some embodiments, the sweep test may be performed after subjecting the electronic device 112 to a preliminary signal (e.g., a voltage, timing signal, etc.) prior to evaluating the electronic device 112 at the first testing point of the sequential testing points.

In view of the foregoing, evaluating the electronic device 112 at a first testing point of the sequential testing points may include subjecting the electronic device 112 to any of the test patterns (e.g., inputs) described above and any conventional test pattern and/or any conventional test mode for testing any of the operating parameters described above.

Evaluating the electronic device 112 at the first testing point may furthermore include determining whether the electronic device 112 returns expected read data (e.g., passes) at the first testing point of the sequential testing points, as shown in act 211 of FIG. 2. Put another way, evaluating the electronic device 112 at the first testing point may include determining whether a condition of the electronic device 112 passes at the first testing point. For example, the electronic device tester 100 may utilize the comparator 106 to compare read data from the electronic device 112 at the first testing point to an expected read data for the first testing point.

In some embodiments, evaluating the electronic device 112 at the first testing point may include repetitively evaluating the electronic device 112 at the first testing point (e.g., writing and reading data or reading data) for ten, twenty, fifty, one hundred, or more iterations. Additionally, the electronic device tester 100 may utilize the comparator 106 to compare read data from the electronic device 112 at each of the iterations at which the first testing point was evaluated to expected read data for the first testing point. In some instances, the electronic device tester 100 may determine that the condition of the electronic device 112 passes at the first testing point if a particular percentage (e.g., threshold) of the iterations at which the first testing point was evaluated returned expected read data. For example, the electronic device tester 100 may determine that the condition of the electronic device 112 passes at the first testing point if at least about 60%, about 70%, about 80%, about 90%, about 95%, or about 99% of the iterations at which the first testing point was evaluated returned expected read data.

Referring still to FIG. 2, if it is determined that the electronic device 112 returned expected read data at the first testing point of the sequential testing points (i.e., the condition of the electronic device 112, as evidenced by the read data, passed at the first testing point), the method 200 may include storing data indicating that the first testing point was a first passing point within the logic circuit of electronic device tester 100, as shown in act 212 of FIG. 2. For example, the method 200 may include setting a value representing the first passing point within result registers of the logic circuit of the electronic device tester 100 as a value representing the first testing point. In particular, the finite-state machines of the pattern generator 108 of the electronic device tester 100 may be clocked by the pattern generator 108 after each testing point of the sequential testing points is tested. For example, upon being clocked, each of the finite-state machines utilizes its current state combined with a pass or fail status of its associated pin to selectively set result registers (e.g., store results). Furthermore, if the first testing point is determined to be a passing point, the method 200 may further include storing data (i.e., updating result registers) indicating that the first testing point may be within the data valid window and may not be a boundary of the data valid window, as shown in act 214 of FIG. 2. For instance, the method 200 may include flagging the data indicating that the first testing point is a passing point. As noted above, the data may be stored within the hardware of the electronic device tester 100.

Referring to acts 212 and 214 together, upon storing data indicating that the first testing point was a passing point, the method 200 may include evaluating the electronic device 112 at a second testing point or subsequent point (referred to herein as "the second testing point") of the sequential testing points, as shown in act 216 of FIG. 2. For example, the electronic device tester 100 may evaluate the electronic device 112 at a second testing point or subsequent point (referred to herein as "the second testing point") of the sequential testing points. Evaluating the electronic device 112 at the second testing point of the sequential testing points (e.g., act 216) is described in greater detail below.

Returning to act 211 of FIG. 2, if it is determined that the electronic device 112 did not return expected read data at the first testing point of the sequential testing points (i.e., the condition of the electronic device 112, as evidenced by the read data, failed at the first testing point), as shown in box 213, the method 200 may also move to evaluating the electronic device 112 at the second testing point of the sequential testing points, as shown in act 216 of FIG. 2, as referenced above. For example, the electronic device tester 100 may evaluate the electronic device 112 at the second testing point or subsequent point (referred to herein as "the second testing point") of the sequential testing points. Evaluating the electronic device 112 at the second testing point of the sequential testing points may include evaluating the electronic device 112 via any of the manners described above in regard to acts 208-212 of FIG. 2.

If it is determined that the electronic device 112 returned expected read data at the second testing point of the sequential testing points (i.e., the condition of the electronic device 112, as evidenced by the read data, passed at the second testing point) and the electronic device 112 did not return expected read data at the first testing point (i.e., failed the first testing point), the method 200 may include storing data indicating that the second testing point is a passing point and is a first passing point, as shown in act 218 of FIG. 2. In particular, the method 200 may include setting a value representing the first passing point within result registers of the logic circuit of the electronic device tester 100 as a value representing the second testing point. For example, data may be stored via any of the manners described above in regard to act 212 of FIG. 2. Furthermore, the method 200 may proceed by evaluating a sequential testing point (e.g., a third testing point) of the sequential testing points, as shown in act 220 of FIG. 2. Evaluating the electronic device 112 at the sequential testing point of the sequential testing points (e.g., act 220) is described in greater detail below.

Additionally, referring still to acts 211 and 216 of FIG. 2, if it is determined that the electronic device 112 returned expected read data at the second testing point of the sequential testing points (i.e., the condition of the electronic device 112, as evidenced by the read data, passed at the second testing point) and the electronic device 112 also returned expected read data at the first testing point (i.e., passed the first testing point), as shown in box 221, the method 200 may also include evaluating a sequential testing point (e.g., a third testing point, a subsequent testing point) of the sequential testing points associated with the testing range of the selected operating parameter, as shown in act 220 of FIG. 2. For example, the electronic device tester 100 may evaluate the electronic device 112 at the sequential testing point (e.g., a third testing point) of the sequential testing points.

Additionally, referring still to acts 211 and 216 of FIG. 2, if it is determined that the electronic device 112 did not return expected read data at the second testing point of the sequential testing points (i.e., the condition of the electronic device 112, as evidenced by the read data, did not pass at the second testing point) but the electronic device 112 returned expected read data at the first testing point (i.e., passed the first testing point), the method 200 may include assigning a most recent passing point of the sequential passed points of the sequential testing points as a last passing point, as shown in act 222 of FIG. 2. For example, act 222 of the method 200 may include storing data indicating that the most recent passing testing point was a last passing point, as shown in act 224 of FIG. 2. In particular, the method 200 may include setting a value representing the last passing point within result registers of the logic circuit of the electronic device tester 100 as a value representing the most recent passing testing point. Act 224 may include storing data via any of the manners described above in regard to act 212 of FIG. 2.

Additionally, referring still to act 222 of FIG. 2, if it is determined that the electronic device 112 did not return expected read data at the second testing point of the sequential testing points but the electronic device 112 returned expected read data at the first testing point (i.e., passed the first testing point), the method 200 may also include determining whether a number of sequential passed points of the sequential testing points is greater than or equal to a required number of sequential passed points of the user defined acceptable data valid window (i.e., the minimum acceptable data valid window size), as shown in act 226 of FIG. 2. For example, the electronic device tester 100 may determine whether the number of sequential passed points is greater than or equal to a required number of sequential passed points of the user defined acceptable data valid window.

If it is determined that the number of sequential passed points of the sequential testing points is not greater than or equal to a required number of sequential passed points of the user defined acceptable data valid window, as represented by arrow 227, the method 200 may include returning to evaluating testing points of the sequential testing points and evaluating a subsequent point (e.g., the third testing point) of the sequential testing points, as shown in and discussed above in regard to act 220 of FIG. 2. For example, the electronic device tester 100 may return to evaluating points of the sequential testing points and evaluating a subsequent point (e.g., the third testing point) of the sequential testing points.

Alternatively, if it is determined that the number of sequential passed points of the sequential testing points is greater than or equal to a required number of sequential passed points of the user defined acceptable data valid window, as shown in arrow 231, the method 200 may include terminating a sweep test, as shown in act 228 of FIG. 2. For example, the electronic device tester 100 may terminate the sweep test. Additionally, if the sweep test has not been completed in full (e.g., not every point of the sequential testing points has been tested), the method 200 may include storing data (e.g., updating the result registers) indicating that the sweep test was not completed prior to identifying an acceptable data valid window for the selected operating parameter, as shown in act 229 of FIG. 2.

If the method 200 proceeds to act 220 of FIG. 2, evaluating the electronic device 112 at the subsequent point of the sequential testing points may include evaluating the electronic device 112 via any of the manners described above in regard to acts 208-212 of FIG. 2. Additionally, the evaluation process for evaluating points described above in regard to acts 216-226 of FIG. 2 may be repeated any number of times for subsequent points of the sequential testing points until a first passing point and a last passing point are identified, as shown in act 230 of FIG. 2. Furthermore, points may be identified as first passing points and last passing points via any of the manners described above in regard to the first and second last passing point. For example, in some instances, the evaluation process described above in regard to acts 216-226 of FIG. 2 may be repeated until a first passing point and a last passing point are identified where a number of sequential passed points of the sequential testing points represented by the first passing point and the last passing point (e.g., between and including the first passing point and the last passing point) is greater than or equal to a required number of sequential passed points of the user defined acceptable data valid window. In other instances, that evaluation process described above in regard to acts 216-226 of FIG. 2 may be repeated until the condition of the electronic device 112 has been evaluated at each testing point of the sequential testing points.

In some embodiments, if a final point of the sequential testing points of the selected operating parameter is determined to be a passing point, the method 200 may include storing data (e.g., updating the result registers) indicating that the final testing point of the sequential testing points was a passing point, as shown in act 232 of FIG. 2. For example, if the final testing point of the sequential testing points was determined to be a passing point and was part of a number of sequential passed points of the sequential testing points that is greater than or equal to a required number of sequential passed points of the user defined acceptable data valid window (e.g., the final point is part of a data valid window), the method 200 may include flagging the final point. For instance, the electronic device tester 100 may flag the data indicating the last passing point as the final testing point within the hardware of the electronic device tester 100.

Additionally, as mentioned above, if an acceptable data valid window is identified prior to finishing a full sweep test (e.g., evaluating the electronic device 112) as each of the sequential testing points, the method 200 may include storing data (e.g., updating result registers) indicating that the sweep test was not completed prior to identifying a data valid window, as shown in act 229 of FIG. 2. For instance, the electronic device tester 100 may flag the data identifying the first passing point and/or the last passing point within the hardware (e.g., the logic circuit) of the electronic device tester 100.

Referring still to FIG. 2, when passing points are identified after a first passing point and prior to a last passing point, the method 200 may include not storing any data (e.g., not updating result registers). For example, the electronic device tester 100 may not store any data (e.g., may not update result registers) when passing points after a first passing point and prior to a last passing point are identified. Additionally, when failing points are identified, the method 200 may include not storing any data (e.g., not updating result registers). For example, the electronic device tester 100 may not store any data (e.g., may not update result registers) when failing points are identified.

Figure 3:
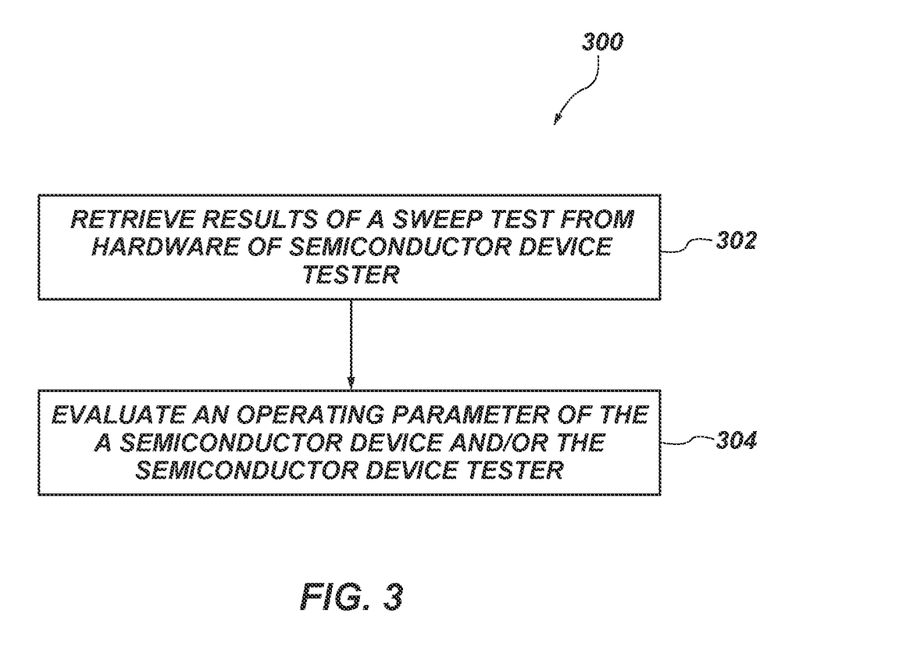
FIG. 3 shows a flow diagram of a method of testing electronic devices according to one or more embodiments of the disclosure.

FIG. 3 depicts a schematic flow chart of a method 300 of evaluating an operating parameter of an electronic device and/or an electronic device tester according to one or more embodiments. In some embodiments, method 300 of FIG. 3 may be a continuation of method 200 of FIG. 2. The description of FIG. 3 includes references to the electronic device tester 100 and the electronic device 112 of FIG. 1.

Method 300 may include retrieving results of a sweep test from hardware (e.g., a hardware state machine, a logic circuit, etc.) of the electronic device tester 100, as shown in act 302 of FIG. 3. For example, retrieving the results of the sweep test from the hardware of the electronic device tester 100 may include retrieving the results via an external controller and/or software application interfacing with the electronic device tester 100. Furthermore, as described briefly above, retrieving the results of the sweep test may include retrieving only data regarding the first and last passing points of identified acceptable data valid windows and other diagnostic information (e.g., data indicating that first testing point was a passing point, the sweep test was not completed, etc.) from the electronic device tester 100.

The method 300 may also include evaluating (e.g., grading, characterizing, defining, etc.) an operating parameter of an electronic device 112 and/or an electronic device tester 100 based at least partially on an identified acceptable data valid window represented by the retrieved first and last passing points, as shown in act 304 of FIG. 3. For example, evaluating the operating parameter of the electronic device 112 and/or the electronic device tester 112-100 may include determining a level of functionality of the electronic device 112 or the electronic device tester 100 in regard to the operating parameter or assigning a grade to the electronic device 112 or the electronic device tester 100 in regard to the operating parameter.

In some embodiments, evaluating the operating parameter of the electronic device 112 and/or the electronic device tester 112-100 may include determining an optimal setting of the operating parameter. In one or more embodiments, determining an optimal setting of the operating parameter may include training the electronic device tester 100. In some embodiments, multiple operating parameter, which may or may not be dependent on each other, may be evaluated in succession until optimal settings are determined from each operating parameters.

In some embodiments, based at least partially on the identified acceptable data valid window, the method 300 may include evaluating one or more of DC voltage parameters and/or AC voltage parameters (device supply voltages, device reference voltages (e.g., Vref)), and device output voltages (e.g., VOH, VOL) or driver voltages (e.g., high and/or low signal voltage levels coming from the electronic device tester 100 to the electronic device 112).

In one or more embodiments, based at least partially on the identified acceptable data valid window, the method 300 may include evaluating one or more AC timing parameters of the electronic device 112. For example, based at least partially on the identified acceptable data valid window, the method 300 may include evaluating one or more of clock frequency, pin-to-pin timings (e.g., setup timing, hold timing, alignment timing, and training timing), command-to-command timings, read-data strobe placement, write-data edge placement, or edge-to-edge timings (e.g., duty cycle).

Referring to FIGS. 1-3 together, the electronic device tester 100 and methods described herein may be advantageous over conventional methods and conventional testers. The electronic device tester 100 and the methods described herein at least substantially replace conventional software approaches for calculating data valid windows. Furthermore, the electronic device tester 100 and methods described herein reduce required testing time and decrease a complexity of software needed for further processing. For example, because the electronic device tester 100 only stores results of the first and last passing points of the sweep test and other minimal diagnostic information, only these results are provided (e.g., output) to testing software, and the testing software only has to process the first and last passing points and the other minimal diagnostic information. Therefore, time conventionally required to read, store, and process the result of each testing point is significantly reduced. For example, pass/fail information for each testing point in the testing range of the sweep test does not need to be read out (e.g., read out to processing software). For instance, the finite-state machine and logic circuit of the electronic device tester 100 only output (e.g., report) the first and last passing points of an identified acceptable data valid window.

Furthermore, some semiconductor devices (e.g., memory devices and/or graphics devices) require data valid window training every time the semiconductor devices are initialized, which occurs in every test. Therefore, in some instances, while the reduction of testing time provided by the electronic device tester 100 and methods described herein is dependent on a resolution of the sweep test (e.g., number and concentration of testing points), a configuration readout time, and other factors, the electronic device tester 100 and methods described herein may reduce conventional training time by more than 50% while achieving higher resolution and simplifying the process.

Additionally, by reducing the amount of time required to test electronic devices, the electronic device tester 100 and methods of the disclosure may decrease production time and may increase overall production. Increasing overall production may lead to increased sales and revenue. Furthermore, by reducing the amount of time required to test electronic devices, the electronic device tester 100 and methods of the disclosure may enable higher resolution tests to be performed within conventional time requirements.

Figure 4:
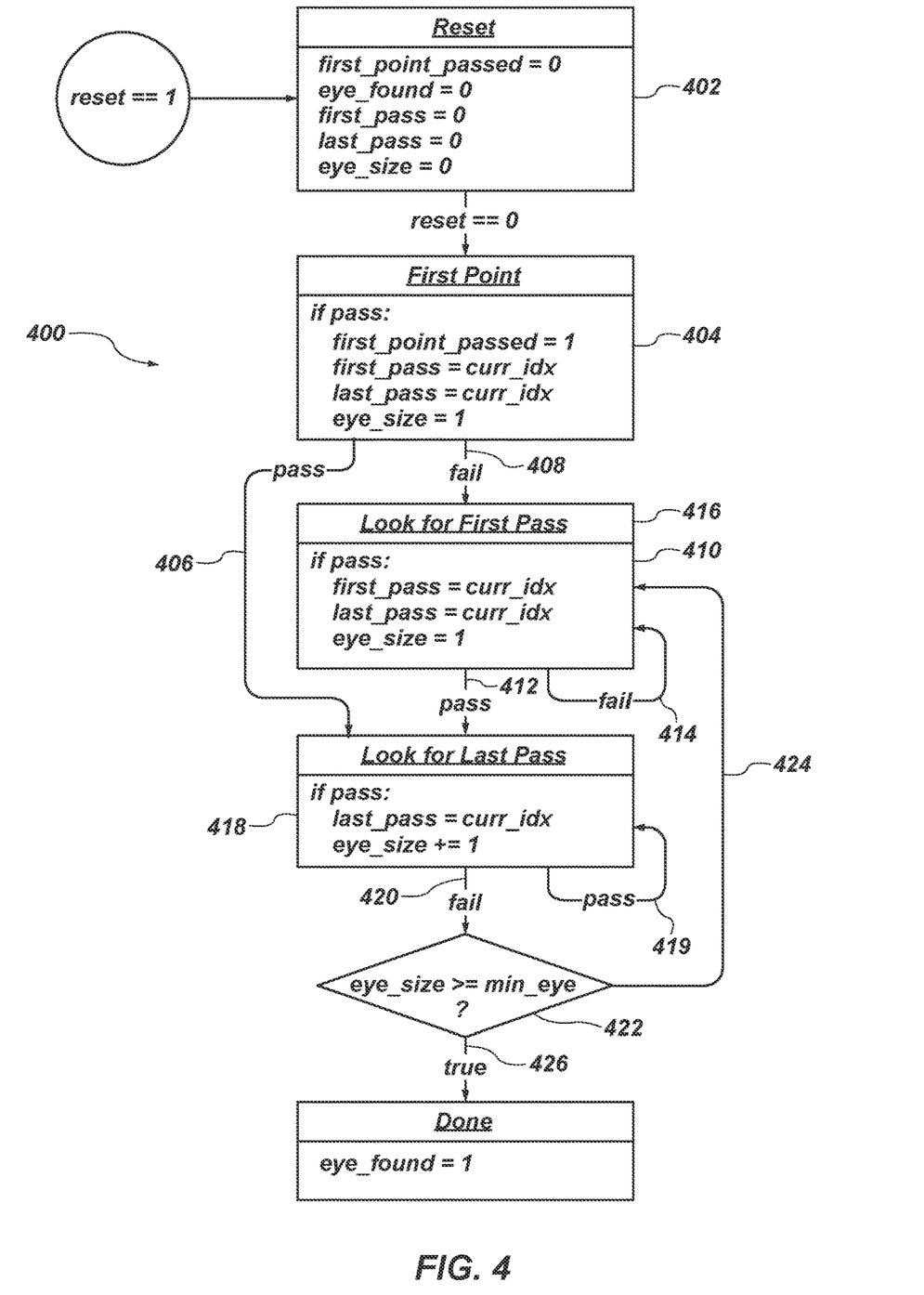
FIG. 4 shows a flowchart of state machine logic for testing electronic devices according to one or more embodiments of the disclosure.

FIG. 4 is a schematic flowchart 400 of an example state machine logic of an electronic device tester (e.g., electronic device tester 100) according to one or more embodiments. The state machine logic may initiate a reset action resetting stored values (e.g., the result registers) within the hardware of the electronic device tester 100 of each of a first-point-passed value, an eye-found value, a first-pass value, a last-pass value, and an eye-size value to zero ("0"), as shown in act 402.

Upon resetting the result registers, the state machine logic may initiate evaluation of a first testing point of a sequential testing points of a testing range associated with a selected operating parameter of the electronic device 112 and/or the electronic device tester 100 for evaluation, as shown in act 404 of FIG. 4. Evaluating the first testing point of the sequential testing points may include any of the actions described above in regard to acts 208-211 of FIG. 2.

Furthermore, the state machine logic may initiate determining whether a condition of the electronic device 112 at the first testing point of the sequential testing points passes or fails, as represented by arrows 406 and 408 of FIG. 4, respectively. The state machine logic may determine whether the condition of the electronic device 112 at the first testing point of the sequential testing points passes or fails via any of the manners described above in regard to acts 211, 216, and 220 of FIG. 2.

If the condition of the electronic device 112 at the first testing point of the sequential testing points fails, the state machine logic may initiate evaluating a sequential testing point of the sequential testing points, as shown in act 410 of FIG. 4. Evaluating the sequential testing point of the sequential testing points may include any of the actions described above in regard to acts 208, 216, and 220 of FIG. 2.

Additionally, the state machine logic may initiate determining whether a condition of the electronic device 112 at the sequential testing point of the sequential testing points passes or fails, as represented by arrows 412 and 414 of FIG. 4, respectively. The state machine logic may determine whether the condition of the electronic device 112 at the sequential testing point of the sequential testing points passes or fails via any of the manners described above in regard to acts 211, 216, and 220 of FIG. 2.

If the condition of the electronic device 112 at the sequential testing point of the sequential testing points fails, the state machine logic may initiate evaluating another sequential testing point of the sequential testing points, as shown in act 416 of FIG. 4. Evaluating the sequential testing point (e.g., the another sequential testing point) of the sequential testing points may include any of the actions described above in regard to acts 208, 216, and 220 of FIG. 2. Additionally, the state machine logic may repeat act 410 and evaluating sequential testing points until the condition of the electronic device 112 at the first testing point of the sequential testing points passes, as represented by arrow 412.

Returning to act 404 and arrow 406 of FIG. 4, if the condition of the electronic device 112 at the first testing point of the sequential testing points passes or the state machine logic identifies a sequential testing point at which the condition of the electronic device 112 passes, the state machine logic may initiate evaluating the condition of the electronic device 112 at further testing points of the sequential testing points until a last passing point of the sequential testing points is identified, as shown in act 418 of FIG. 4. For example, act 418 of FIG. 4 may be repeated (arrow 419) until the condition of the electronic device 112 at a testing point (e.g., a further sequential testing point) of the sequential testing points fails, as represented by arrow 420 of FIG. 4. Evaluating the sequential testing points of the sequential testing points may include any of the actions described above in regard to acts 208, 216, and 220 of FIG. 2. Additionally, the state machine logic may determine whether the condition of the electronic device 112 at the sequential testing points of the sequential testing points passes or fails via any of the manners described above in regard to acts 211, 216, and 220 of FIG. 2.

Referring to acts 404 and 418 together, upon identifying a first passing point, the state machine logic may set the first-pass value of the result registers to a value representing the first testing point (e.g., curr_idx) to pass.

Additionally, upon identifying a testing point at which the condition of the electronic device 112 at the sequential testing points of the sequential testing points fails, where the identified failing testing point immediately follows an immediately preceding passing point, the state machine logic may set the last-pass value of the result registers to a value representing the last testing point (e.g., curr_idx) to pass (e.g., the immediately preceding passing point).

Additionally, upon identifying a last passing point, the state machine logic may initiate a determination as to whether a number of sequential passing points (e.g., an eye-size) represented by the first passing point and the last passing point is greater than or equal to a minimum required number of sequential passing points (e.g., a min-eye size), as shown in act 422 of FIG. 4. The state machine logic may determine whether a number of sequential passing points (e.g., an eye value) is greater than or equal to a minimum required number of sequential passing points via any of the manners described above in regard to act 226 of FIG. 2.

If the state machine logic determines that the number of sequential passing points (e.g., an eye-size) represented by the first passing point and the last passing point is not greater than or equal to a minimum required number of sequential passing points (e.g., a min-eye size), the state machine logic may return to act 410, as represented by arrow 424, and may again initiate evaluating of sequential testing points of the sequential testing points until a new first passing point is identified. Furthermore, acts 416, 418, 422, and 424 may be repeated until a number of sequential passing points (e.g., an eye-size) represented by a first passing point and a last passing point is greater than or equal to a minimum required number of sequential passing points is identified or until a sweep test is completed.

In response to identifying a number of sequential passing points greater than or equal to a minimum required number of sequential passing points (e.g., a min-eye size), the state machine logic may terminate a sweep test, as shown in act 426.

Referring to FIGS. 2-4, the methods 200 and 300 and logic flow 400 may further include grading and sorting electronic devices based at least partially on the evaluation of the operating parameters of the electronic devices.

Referring to FIGS. 1-4 together, while embodiments of the disclosure describe utilizing a logic circuit for performing the methods describe herein, the disclosure is not so limited. Rather, the acts and methods described herein are applicable to electronic device testers having memory controllers as well. Furthermore, the acts and methods described herein are applicable to memory controllers themselves.

Embodiments of the disclosure include a tester. The tester includes a pattern generator, at least one finite-state machine, and a logic circuit. The logic circuit may be configured to: in response to a selected operating parameter to evaluate, evaluate an electronic device at a first testing point of a testing range for evaluating the selected operating parameter, comprising: acquire read data from the electronic device at the first testing point of the testing range; and write data within the logic circuit indicating that the first testing point is a first passing point based at least in part on a first value of the read data associated with the first testing point; evaluate the electronic device at a second testing point of the testing range, comprising: acquire read data from the electronic device at the second testing point of the testing range; and write data within the logic circuit indicating that the second testing point is the first passing point based at least in part on a second value of the read data associated with the second testing point; evaluate the electronic device at one or more further testing points of the testing range until the first passing point and a last passing point are identified; and upon identifying the last passing point, write data within the logic circuit indicating the last passing point.

One or more embodiments of the disclosure include a method. The method may include sequentially acquiring read data from an electronic device at a sequential testing points of a testing range for evaluating an operating parameter of the electronic device or an electronic device tester until a first passing point and a last passing point of a set (e.g., a plurality) of consecutive passing points are identified; in response to identifying a first passing point, writing data within a logic chip of the electronic device tester identifying the first passing point; in response to identifying a last passing point, writing data within the logic chip of the electronic device tester identifying the last passing point; determining whether a data valid window represented by the identified first passing point and the identified last passing point is greater than or equal to a user-defined, acceptable data valid window; in response to determining that the data valid window represented by the identified first passing point and the identified last passing point is greater than or equal to a user-defined, acceptable data valid window, terminating evaluation of the electronic device; in response to determining that the data valid window represented by the identified first passing point and the identified last passing point is not greater than or equal to a user-defined, acceptable data valid window, continuing to evaluate the electronic device at further testing points of the sequential testing points of the testing range until a new first passing point and a new last passing point of a new set of consecutive passing points are identified; and based at least partially on the data valid window, evaluating the operating parameter of the electronic device or an electronic device tester.

Some embodiments of the disclosure include an apparatus. The apparatus includes an interface (e.g., a probe card (needle type, vertical type, and MEMS (Micro Electro-Mechanical System) type), a non-contact probe (e.g., RF probe), any conventional interface) configured to interface with an electronic device and a logic circuit. The logic circuit includes a pattern generator and at least one finite-state machine. The logic circuit may be configured to: sequentially acquire read data from the electronic device at a sequential testing points of a testing range for evaluating an operating parameter of the electronic device or the tester until a set of consecutive passing points having a first passing point and a last passing point is identified; in response to identifying the first passing point, write data within the logic circuit of the tester identifying the first passing point; in response to identifying the last passing point, write data within the logic circuit of the tester identifying the last passing point; and output only data identifying the first passing point and data identifying the last passing point to a software application.

Embodiments of the disclosure include a method. The method may include sequentially acquiring read data from an electronic device at a sequential testing points of a testing range via a tester for evaluating an operating parameter of the electronic device or the tester until a window having a set of consecutive passing points having a first passing point and a last passing point is identified; in response to identifying the first passing point, writing data within a logic circuit of the tester; in response to identifying the last passing point, writing data within the logic circuit of the tester; outputting only data identifying the first passing point and data identifying the last passing point to a software application; and based at least partially on the data identifying the first passing point and the data identifying the last passing point, evaluating the operating parameter of the electronic device or an electronic device tester.

While the disclosure has been described herein with respect to certain illustrated embodiments, those of ordinary skill in the art will recognize and appreciate that it is not so limited. Rather, many additions, deletions, and modifications to the illustrated embodiments may be made without departing from the scope of the invention as claimed, including legal equivalents thereof. In addition, features from one embodiment may be combined with features of another embodiment while still being encompassed within the scope of the disclosure as contemplated by the inventors. Further, embodiments of the disclosure have utility with different and various tool types and configurations.

What is claimed is:

1. An apparatus, comprising:
a pattern generator,
at least one finite-state machine; and
a logic circuit configured to:
in response to a selected operating parameter to evaluate, evaluate an electronic device at a first testing point of a testing range for evaluating the selected operating parameter, comprising:
acquire read data from the electronic device at the first testing point of the testing range; and
write data within a first register of the logic circuit indicating that the first testing point is a first passing point based at least in part on a first value of the read data associated with the first testing point;
evaluate the electronic device at a second testing point of the testing range, comprising:
acquire read data from the electronic device at the second testing point of the testing range; and
write data within a second register of the logic circuit indicating that the second testing point is a passing point based at least in part on a second value of the read data associated with the second testing point; and
repeat the evaluation of the electronic device at each one of further testing points of the testing range, including to acquire read data from the electronic device and to write data within the second register of the logic circuit for each one of further passing points until a further testing point fails, so that the data remaining within the second register of the logic circuit indicating a preceding passing point indicates the last passing point.

2. The apparatus of claim 1, wherein the logic circuit is further configured to determine whether a data valid window represented by the first passing point and the last passing point is greater than or equal to a user-defined, acceptable data valid window.

3. The apparatus of claim 2, wherein the logic circuit is further configured to, in response to determining that the data valid window represented by the first passing point and the last passing point is greater than or equal to the user-defined, acceptable data valid window, terminate evaluation of the electronic device.

4. The apparatus of claim 2, wherein the logic circuit is further configured to, in response to determining that the data valid window represented by the first passing point and the last passing point is not greater than or equal to the user-defined, acceptable data valid window, sequentially evaluate the electronic device at further testing points of the testing range until a new first passing point and a new last passing point are identified.

5. The apparatus of claim 1, wherein the testing range represents a time period and each testing point within the testing range represents a time point within that time period.

6. The apparatus of claim 1, wherein the testing range represents a range of input voltages and each testing point within the testing range represents a unique input voltage value within the range of input voltages.

7. The apparatus of claim 1, wherein the testing range represents a range of input timing signals and each testing point within the testing range represents a unique input timing signal within the range of input timing signals.

8. The apparatus of claim 1, wherein the logic circuit is further configured to receive a selection of the selected operating parameter from an external system.

9. The apparatus of claim 1, wherein the selected operating parameter comprises an operating parameter of the electronic device.

10. The apparatus of claim 1, wherein the selected operating parameter comprises an operating parameter of the apparatus which is an electronic device tester.

11. The apparatus of claim 1, wherein evaluating the electronic device at the first testing point of the testing range further comprises subjecting the electronic device to an input signal prior to acquiring read data from the electronic device at the first testing point of the testing range.

12. The apparatus of claim 1, wherein the selected operating parameter comprises a DC voltage parameter or an AC voltage parameter of the electronic device.

13. The apparatus of claim 1, wherein the selected operating parameter comprises an AC timing parameter of the electronic device or an AC timing parameter of the apparatus which is an electronic device tester.

14. The apparatus of claim 1, wherein evaluating the electronic device at the first testing point of the testing range comprises:
repetitively evaluating the electronic device at the first testing point for a plurality of iterations;
determining if the read data from the electronic device at each of the iterations of the first testing point matches expected read data for the first testing point; and
determining whether a threshold percentage of the iterations of the first testing point result in read data from the electronic device that match expected read data for the first testing point.

15. A method comprising:
sequentially acquiring read data from an electronic device at sequential testing points of a testing range for evaluating an operating parameter of the electronic device or an electronic device tester until a first passing point and a last passing point of consecutive passing points are identified;

in response to identifying the first passing point, writing data within a first register of a logic chip of the electronic device tester identifying the first passing point;

in response to identifying a passing point after the first passing point, writing data within a second register of the logic chip of the electronic device tester identifying the passing point;

repeating the writing of data within the second register of the logic chip for each one of further passing points until a sequential testing point fails, so that the data remaining within the second register of the logic chip identifying a preceding passing point identifies the last passing point;

determining whether a data valid window represented by the identified first passing point and the identified last passing point is greater than or equal to a user-defined, acceptable data valid window;

in response to determining that the data valid window represented by the identified first passing point and the identified last passing point is greater than or equal to a user-defined, acceptable data valid window, terminating evaluation of the electronic device;

in response to determining that the data valid window represented by the identified first passing point and the identified last passing point is not greater than or equal to a user-defined, acceptable data valid window, continuing to evaluate the electronic device at further testing points of the sequential testing points of the testing range until a new first passing point and a new last passing point of a new set of consecutive passing points are identified; and based at least partially on the data valid window, evaluating the operating parameter of the electronic device or an electronic device tester.

16. The method of claim 15, further comprising:
in response to read data of a given testing point of the sequential testing points of the testing range not matching expected read data of the given testing point, not writing any data within the logic chip.

17. The method of claim 15, wherein identifying the first passing point comprises:
acquiring read data from the electronic device at a given testing point of the sequential testing points of the testing range; and
determining that the read data from the electronic device at the given testing point matches expected read data associated with the given testing point.

18. The method of claim 15, wherein sequentially acquiring read data from the electronic device at the sequential testing points of the testing range comprises:
inputting a range of voltage values into the electronic device; and
acquiring read data from the electronic device in response to inputting each voltage value of the range of voltage values.

19. The method of claim 15, wherein sequentially acquiring read data from the electronic device at the sequential testing points of the testing range comprises acquiring read data at time points within a period of time.

20. The method of claim 15, wherein evaluating the operating parameter of the electronic device or the electronic device tester comprises at least one of determining a level of functionality of the electronic device or the electronic device tester in regard to the operating parameter or assigning a grade to the electronic device or the electronic device tester in regard to the operating parameter.

21. The method of claim 15, wherein evaluating the operating parameter of the electronic device or the electronic device tester comprises evaluating a DC voltage parameter or an AC voltage parameter of the electronic device.

22. The method of claim 15, wherein evaluating the operating parameter of the electronic device or the electronic device tester comprises evaluating an AC timing parameter of the electronic device or an AC timing parameter of the electronic device tester.

23. The method of claim 15, further comprising receiving a selection of the operating parameter from an external application.

24. An apparatus, comprising:
an interface configured to interface with an electronic device;
a pattern generator;
at least one finite-state machine; and
a logic circuit configured to:
sequentially acquire read data from the electronic device at sequential testing points of a testing range for evaluating an operating parameter until consecutive passing points having a first passing point and a last passing point are identified;
in response to identifying the first passing point, write data within a first register of the logic circuit indicating the first passing point;
in response to identifying a passing point after the first passing point, write data within a second register of the logic circuit indicating the passing point;
repeat the writing of data within the second register of the logic circuit for each one of further passing points until a sequential testing point fails, so that the data remaining within the second register of the logic circuit indicating a preceding passing point indicates the last passing point; and
output data identifying the first passing point and data identifying the last passing point to a software application.

25. A method comprising:
sequentially acquiring read data from an electronic device at sequential testing points of a testing range via a tester for evaluating an operating parameter of the electronic device or the tester until a window having consecutive passing points having a first passing point and a last passing point is identified;
in response to identifying the first passing point, writing data within a first register of a logic circuit of the tester indicating the first passing point;
in response to identifying a passing point after the first passing point, writing data within a second register of the logic circuit indicating the passing point;
repeating the writing of data within the second register of the logic circuit for each one of further passing points until a sequential testing point fails, so that the data remaining within the second register of the logic circuit indicating a preceding passing point indicates the last passing point;
outputting data identifying the first passing point and data identifying the last passing point to a software application; and
based at least partially on the data identifying the first passing point and the data identifying the last passing point, evaluating the operating parameter of the electronic device or an electronic device tester.

* * * * *

UNITED STATES PATENT AND TRADEMARK OFFICE
CERTIFICATE OF CORRECTION

| | |
|---|---|
| PATENT NO. | : 11,815,554 B2 |
| APPLICATION NO. | : 17/153726 |
| DATED | : November 14, 2023 |
| INVENTOR(S) | : Phillip A. Rasmussen and Christopher D. Gagliano |

It is certified that error appears in the above-identified patent and that said Letters Patent is hereby corrected as shown below:

In the Specification

| | | |
|---|---|---|
| Column 2, | Line 16, | change ""consisting of"" to --"consisting of,"-- |
| Column 8, | Line 9, | change "device **112** at least" to --device **112** at at least-- |
| Column 11, | Line 48, | change "and second last passing" to --and last passing-- |
| Column 12, | Line 62, | change "tester **112-100** may" to --tester **100** may-- |
| Column 13, | Line 3, | change "tester **112-100** may" to --tester **100** may-- |

In the Claims

| | | | |
|---|---|---|---|
| Claim 1, | Column 17, | Line 37, | change "a pattern generator," to --a pattern generator;-- |

Signed and Sealed this
Thirteenth Day of February, 2024

Katherine Kelly Vidal
*Director of the United States Patent and Trademark Office*